(12) United States Patent
Huang et al.

(10) Patent No.: US 11,664,354 B2
(45) Date of Patent: May 30, 2023

(54) ELECTRONIC DEVICE

(71) Applicant: InnoLux Corporation, Miao-Li County (TW)

(72) Inventors: Wan-Ling Huang, Miao-Li County (TW); Chun-Hsien Lin, Miao-Li County (TW); Yi-An Chen, Miao-Li County (TW); Tsau-Hua Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 80 days.

(21) Appl. No.: 17/107,856

(22) Filed: Nov. 30, 2020

(65) Prior Publication Data
US 2021/0335761 A1 Oct. 28, 2021

(30) Foreign Application Priority Data
Apr. 22, 2020 (CN) .......................... 202010322769.0

(51) Int. Cl.
| | |
|---|---|
| H01L 25/075 | (2006.01) |
| H01L 33/50 | (2010.01) |
| H01L 33/56 | (2010.01) |
| H01L 33/62 | (2010.01) |
| G02F 1/13357 | (2006.01) |
| G02F 1/1333 | (2006.01) |
| H01L 27/32 | (2006.01) |
| H01L 33/58 | (2010.01) |
| H01L 33/54 | (2010.01) |

(52) U.S. Cl.
CPC ........ *H01L 25/0753* (2013.01); *H01L 33/505* (2013.01); *H01L 33/54* (2013.01); *H01L 33/56* (2013.01); *H01L 33/62* (2013.01)

(58) Field of Classification Search
CPC . H01L 27/3293; H01L 33/60; H01L 25/0753; G02F 1/13336
See application file for complete search history.

(56) References Cited

U.S. PATENT DOCUMENTS

| | | |
|---|---|---|
| 5,812,226 A | 9/1998 | Izumi |
| RE41,603 E | 8/2010 | Matthies |
| 8,232,718 B2 | 7/2012 | Cok |

(Continued)

FOREIGN PATENT DOCUMENTS

| | | | |
|---|---|---|---|
| CN | 107065417 A | 8/2017 | |
| EP | 3 439 033 A1 | 2/2019 | |
| EP | 3621109 A1 * | 3/2020 | ......... H01L 25/0753 |

*Primary Examiner* — Antonio B Crite
(74) *Attorney, Agent, or Firm* — Winston Hsu

(57) ABSTRACT

An electronic device is provided in this disclosure. In some embodiments, the electronic device includes two display panels, a first filling element, and a second filling element. The two display panels adjoin each other. The first filling element and the second filling element are disposed between the two display panels, and a material of the first filling element is different from a material of the second filling element. In some embodiments, the electronic device includes a protection substrate, two light emitting plates, and a filling element. The two light emitting plates adjoin each other. The protection substrate is disposed corresponding to the two light emitting plates, and the two light emitting plates emit light towards the protection substrate. The filling element is disposed between the two light emitting plates.

15 Claims, 10 Drawing Sheets

(56) References Cited

U.S. PATENT DOCUMENTS

| | | |
|---|---|---|
| 2002/0140629 A1 | 10/2002 | Sundahl |
| 2003/0071566 A1* | 4/2003 | Kwasnick ............ H01L 27/3293 |
| | | 313/506 |
| 2018/0047880 A1* | 2/2018 | Lim ......................... H01L 33/54 |
| 2018/0190747 A1* | 7/2018 | Son ............................ G09G 3/32 |
| 2019/0122592 A1* | 4/2019 | Han .................... H01L 25/0753 |
| 2020/0089047 A1 | 3/2020 | Baek |

* cited by examiner

ELECTRONIC DEVICE

BACKGROUND OF THE DISCLOSURE

1. Field of the Disclosure

The present disclosure relates to an electronic device, and more particularly, to an electronic device including a filling element.

2. Description of the Prior Art

Flat display panels have been widely used in electronic devices such as mobile phones, televisions, monitors, tablet computers, and desktop computers. However, because of the limitation of the process apparatus and the size of the process substrate, many large-area displays (such as outdoor display boards) cannot be formed using only a single display panel, but multiple display panels have to adjoin one another to provide a larger display performance. The overall visual effect tends to be influenced by the gap between the tiled display panels, so how to improve the display effect and/or related characteristics of the tiled display device through the design of materials and/or structure is the direction of development in related fields.

SUMMARY OF THE DISCLOSURE

It is one of the objectives of the present disclosure to provide an electronic device. A filling element is disposed between adjoined display panels or adjoined light emitting plates for improving related performance of the electronic device.

An electronic device is provided in an embodiment of the present disclosure. The electronic device includes two display panels, a first filling element, and a second filling element. The two display panels adjoin each other. The first filling element and the second filling element are disposed between the two display panels, and a material of the first filling element is different from a material of the second filling element.

An electronic device is provided in another embodiment of the present disclosure. The electronic device includes a protection substrate, two light emitting plates, and a filling element. The two light emitting plates adjoin each other. The protection substrate is disposed corresponding to the two light emitting plates, and the two light emitting plates emit light towards the protection substrate. The filling element is disposed between the two light emitting plates.

These and other objectives of the present disclosure will no doubt become obvious to those of ordinary skill in the art after reading the following detailed description of the embodiment that is illustrated in the various figures and drawings.

DETAILED DESCRIPTION

Certain terms are used throughout the description and following claims to refer to particular components. As one skilled in the art will understand, equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

Herein, the terms "about", "approximately", "substantially", and "essentially" usually mean within 10%, or within 5%, or within 3%, or 2% or within 1%, or within 0.5% of a given value or range. The quantity given here is an approximate quantity, that is, the meaning of "about", "approximately", "substantially", and "essentially" can still be implied without specifying the terms "about", "approximately", "substantially", and "essentially". In addition, the terms "a range from a first value to a second value" and "a range between a first value and a second value" indicate that the range includes the first value, the second value, and other values in between.

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods. The use of these ordinal numbers is only used to make a claimed element with a certain name clear from another claimed element with the same name.

It should be understood that embodiments are described below to illustrate different technical features, but these technical features may be mixed to be used or combined with one another in different ways without conflicting with one another.

Figure 1:
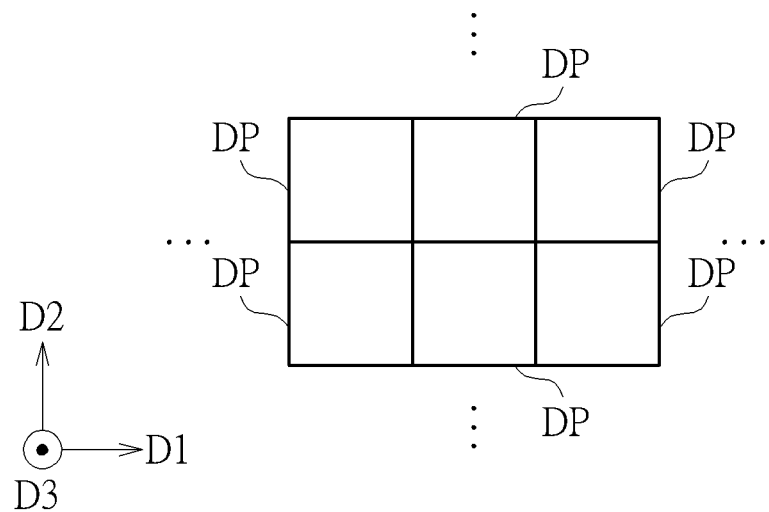
FIG. 1 is a top-view schematic diagram illustrating an electronic device according to an embodiment of the present disclosure.
Figure 2:
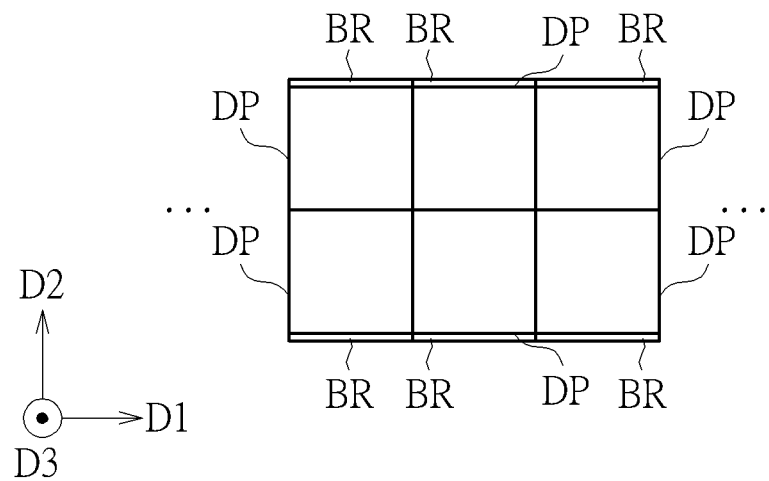
FIG. 2 is a top-view schematic diagram illustrating an electronic device according to another embodiment of the present disclosure.

Please refer to FIG. 1 and FIG. 2. FIG. 1 is a top-view schematic diagram illustrating an electronic device according to an embodiment of the present disclosure, and FIG. 2 is a top-view schematic diagram illustrating an electronic device according to another embodiment of the present disclosure. As shown in FIG. 1, in some embodiments, display panels DP may be arranged repeatedly and adjoin one another in a first direction D1 and a second direction D2 for forming n times m display panels DP adjoining one another, wherein n and m may be positive integers greater than or equal to 2 respectively. In some embodiments, the first direction D1 and the second direction D2 may be substantially perpendicular to each other, and a third direction D3 may be orthogonal to the first direction D1 and the second direction D2 respectively. The adjoined display panels DP may not overlap one another in the third direction D3, and the third direction D3 may be regarded as a thickness direction of the electronic device, but not limited thereto. As shown in FIG. 2, in some embodiments, there may be only two display panels DP arranged repeatedly and adjoining each other in the second direction D2, and there may be n display panels DP arranged repeatedly and adjoining one another in the first direction D1 for forming $2n$ display panels DP adjoining one another, wherein n may be a positive integer greater than or equal to 2. In this situation, border regions BR of the display panels DP may be disposed at opposite sites in the second direction D2 for providing space for related wirings and/or space for being bonded with other components (such as circuit boards), but not limited thereto. In other words, each of the display panels DP may be a three-side borderless display panel or a four-side borderless display panel, but not limited thereto. It is worth noting that the electronic device in the present disclosure is not limited to the adjoining and arrangement approaches shown in FIG. 1 and FIG. 2 described above, and the adjoining and arrangement approaches shown in FIG. 1 and FIG. 2 may also be applied in other embodiments of the present disclosure.

Figure 3:
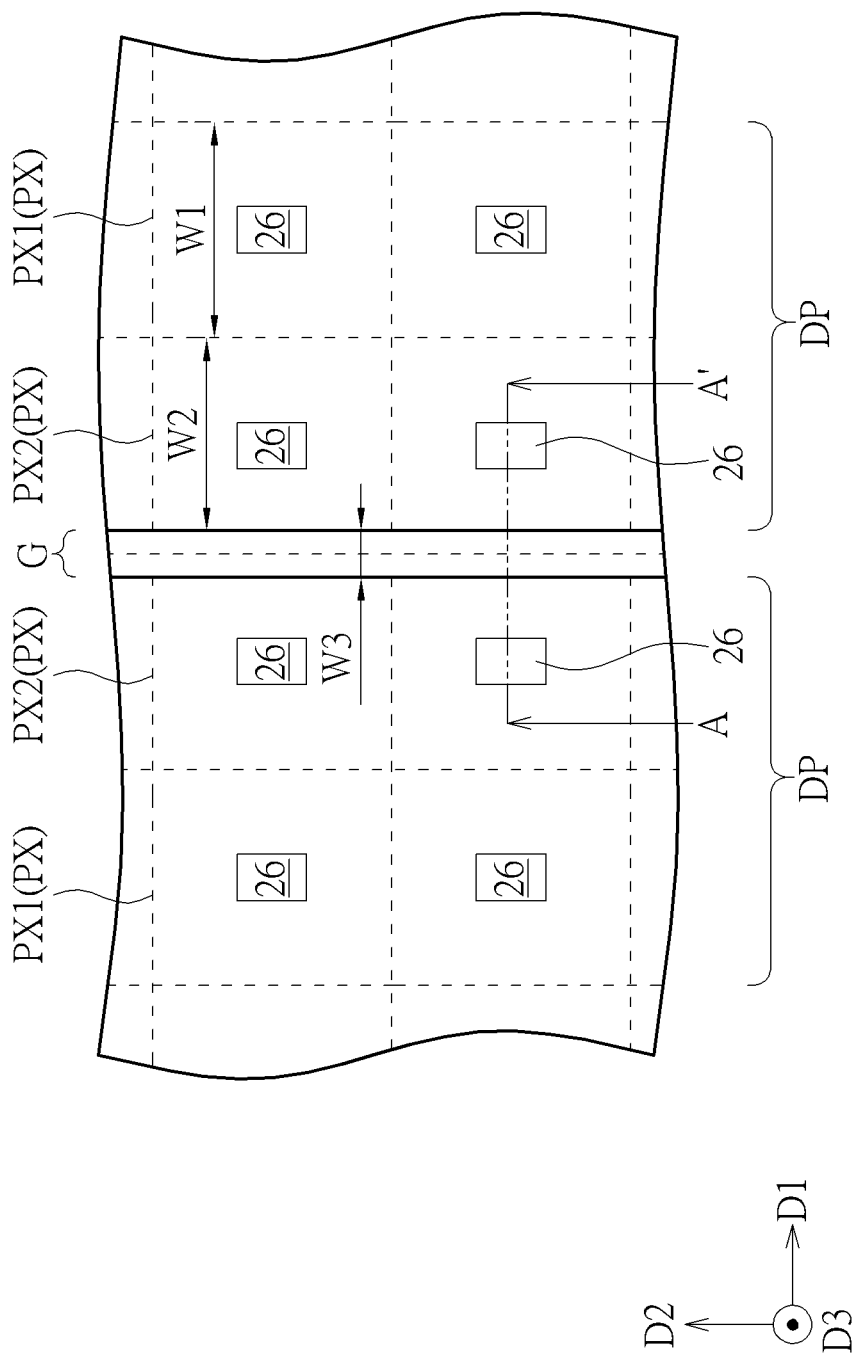
FIG. 3 is a top-view schematic diagram illustrating an electronic device according to a first embodiment of the present disclosure.
Figure 4:
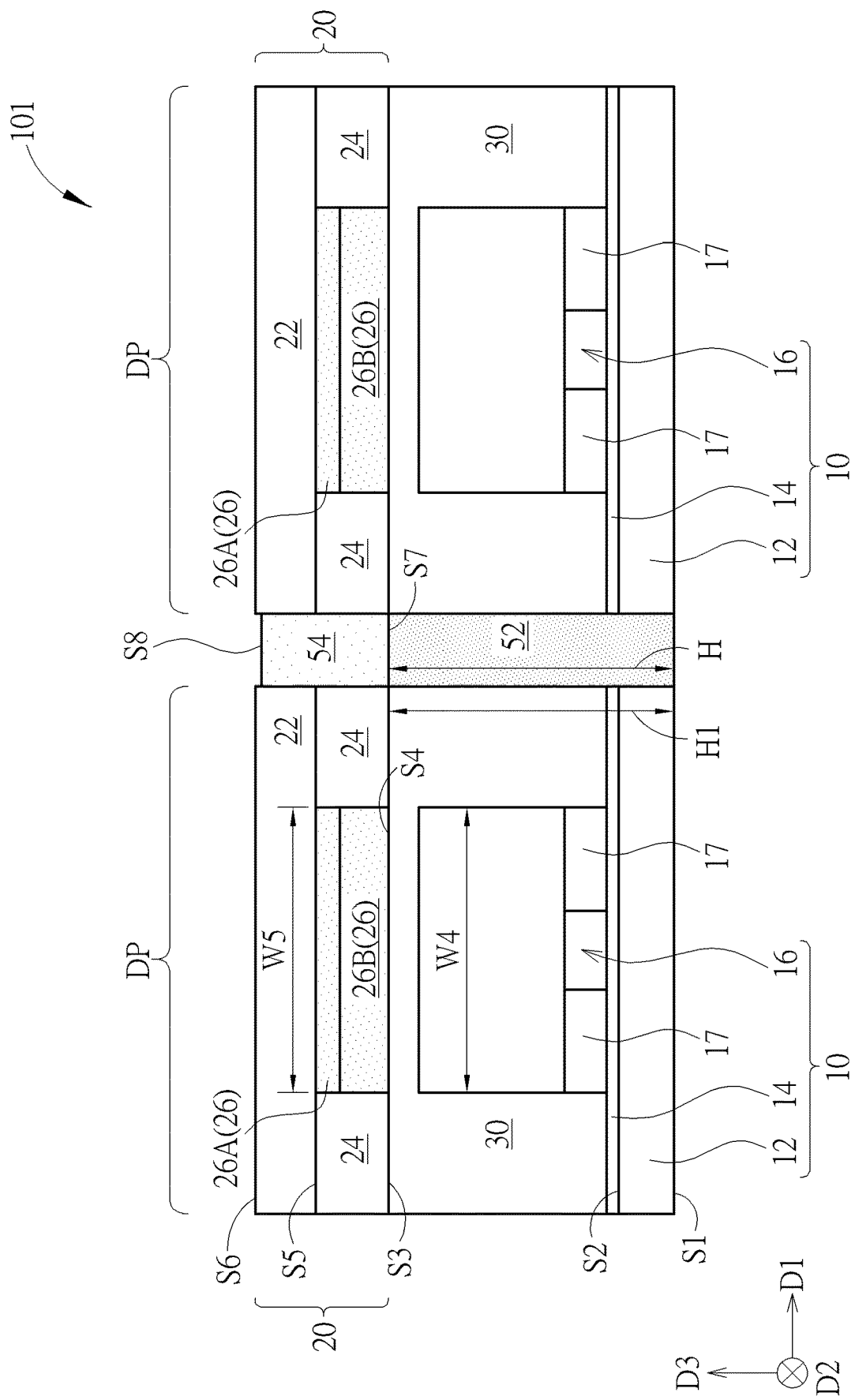
FIG. 4 is a cross-sectional diagram taken along a line A-A' in FIG. 3.

Please refer to FIG. 3 and FIG. 4. FIG. 3 is a top-view schematic diagram illustrating an electronic device according to a first embodiment of the present disclosure, and FIG. 4 is a cross-sectional diagram taken along a line A-A' in FIG. 3. As shown in FIG. 3 and FIG. 4, an electronic device 101 is provided in this embodiment, and the electronic device 101 includes two display panels DP, a filling element 52, and a filling element 54. The two display panels DP adjoin each other. The filling element 52 and the filling element 54 are disposed between the two display panels DP, and a material of the filling element 52 is different from a material of the filling element 54.

Specifically, in some embodiments, the two display panels DP may be disposed adjacent to each other and adjoining each other in the first direction D1, a gap G may exist between the two display panels DP, and the filling element 52 and the filling element 54 may be disposed in the gap G In some embodiments, each of the display panels DP may include a plurality of pixel regions PX for generating corresponding color light and presenting display effects. The pixel regions which are not adjacent to the gap G may be regarded as first pixel regions PX1, and the pixel regions adjacent to the gap G may be regarded as second pixel regions PX2. In some embodiments, the dimension of the second pixel region PX2 may be adjusted for reducing the influence of the gap G between the two display panels DP on the appearance of the electronic device 101. For example, a width W1 of each of the first pixel regions PX1 in the first direction D1 may be different from a width W2 of each of the second pixel regions PX2 in the first direction D1. In some embodiments, the width W2 of each of the second pixel regions PX2 in the first direction D1 may be less than the width W1 of each of the first pixel regions PX2 in the first direction D1 for reducing a distance between center points of two second pixel regions PX2 adjacent to each other in the first direction D1 and belonging to different display panels DP, and the influence of the gap G on the appearance of the electronic device 101 and/or the display operation of the electronic device may be reduced accordingly. In some embodiments, the width W1 of the first pixel region PX1 in the first direction D1 may be substantially equal to the sum of half a width W3 of the gap G in the first direction D1 and the width W2 of the second pixel region PX2 in the first direction D1 (W1=W2+0.5*W3), but not limited thereto.

In some embodiments, the filling element 52 and the filling element 54 may have different characteristics due to different materials for providing different functions. For example, a water vapor transmission rate (WVTR) of the filling element 52 is lower than or equal to a water vapor transmission rate of the filling element 54, and an optical density (OD) of the filling element 52 is higher than or equal to an optical density of the filling element 54, but the present disclosure is not limited to this and the material composition of the filling element 52 and the material composition of the filling element 54 may be modified respectively according to design needs for generating differences between the filling element 52 and the filling element 54 in other properties (such as refractive index, adhesion, and so forth).

In some embodiments, each of the display panels DP may include a light emitting plate 10 and a protection substrate 20. At least a portion of the filling element 52 may be disposed between the two light emitting plates 10 of the two display panels DP, and at least a portion of the filling element 54 may be disposed between the two protection substrates 20 of the two display panels DP, but the present disclosure is not limited to this. In other embodiments of the present disclosure, the display panel DP may also be formed with other structures according to design needs. In some embodiments, each of the light emitting plates 10 may include a first substrate 12 and a plurality of light emitting elements 16. The light emitting elements 16 are disposed on the first substrate 12, and the display elements 16 may be disposed in corresponding pixel regions PX respectively. For convenience, one light emitting element 16 of each of the display panels DP is illustrated in FIG. 4, but each of the pixel regions PX in FIG. 3 may include at least one light emitting element 16, and each of the display panels DP may include a plurality of the light emitting elements 16 disposed on the first substrate 12 accordingly. In some embodiments, each of the light emitting plates 10 may further include a circuit structure 14 disposed on the first substrate 12, the light emitting element 16 may be electrically connected with the circuit structure 14 via a connection structure 17, and the circuit structure 14 may include a driving structure, such as a thin film transistor (TFT) array, and/or other suitable circuit units. It is worth noting that the circuit structure 14 shown in each figure of the present disclosure is only for illustration and not limited to a single-layer structure, and the distribution of the circuit structure 14 on the first substrate 12 may be modified according to design needs.

In some embodiments, each of the light emitting elements 16 may include a self-luminous light emitting element, a non-self-luminous light emitting element with a backlight module, or other suitable types of light emitting structures. The self-luminous light emitting element described above may include but is not limited to a light emitting diode (LED) element, and the light emitting diode may include a sub-millimeter light emitting diode (mini-LED), a micro light emitting diode (micro-LED), an organic light emitting diode (OLED), a quantum dot light emitting diode (QD-LED), or a combination thereof, and the non-self-luminous light emitting element described above may include but is not limited to a liquid crystal display element, a MEMS display element, or other suitable structures.

In some embodiments, each of the protection substrates 20 may include a second substrate 22 and optionally include a color conversion layer 26 disposed on the second substrate 22. Each of the light emitting elements 16 may be disposed corresponding to the color conversion layer 26 in the third direction D3 for emitting light towards the protection substrate 20, and the light from the light emitting element 16 may be converted or filtered into the desired color light by the color conversion layer 26 in the protection substrate 20 and emitted outward to form a display effect. In some embodiments, a width of the light emitting element 16 (such as a width W4 in the first direction D1 shown in FIG. 4) may be substantially equal to or different from a width of the corresponding color conversion layer 26 (such as a width W5 in the first direction D1 shown in FIG. 4) according to design needs. The material of the first substrate 12 and the material of the second substrate 22 may include glass, plastic, polymer material, such as polyimide (PI), polyethylene naphthalate (PEN), polycarbonate (PC), polyurethane, polydimethylenesiloxane, and/or polyethylene terephthalate (PET), at least one of the materials mentioned above, a mixture of the materials mentioned above, or other suitable materials. In addition, the first substrate 12 may be disposed corresponding to the second substrate 22 in the third direction D3, the first substrate 12 may have two opposite surfaces in the third direction D3 (such as surface S1 and a surface S2 shown in FIG. 4), and the second substrate 22 may have two opposite surfaces in the third direction D3 (such as surface S5 and a surface S6 shown in FIG. 4). The surface S2 of the first substrate 12 may be relatively closer to the second substrate 22, the surface S1 of the first substrate 12 may be relatively far away from the second substrate 22, the surface S5 of the second substrate 22 may be relatively closer to the first substrate 12, and the surface S6 of the second substrate 22 may be relatively away from the first substrate 12, but not limited thereto. The circuit structure 14 and the light emitting element 16 may be disposed on the surface S2 of the first substrate 12, and the color conversion layer 26 may be disposed on the surface S5 of the second substrate 22.

In some embodiments, each of the display panels DP may further include an isolation structure (such as a first isolation structure 24 shown in FIG. 4) and a protection layer 30. The first isolation structure 24 may be disposed on the surface S5 of the second substrate 22 and surround the color conversion layer 26, and the first isolation structure 24 may provide light-shielding effect and/or banking effect, but not limited thereto. In addition, the protection layer 30 may cover the light emitting element 16 and at least a portion of the protection layer 30 may be disposed between the light emitting element 16 and the color conversion layer 26 corresponding to this light emitting element 16 for providing protection effect and/or effect of bonding the light emitting plate 10 and the protection substrate 20, but not limited thereto. In some embodiments, the first isolation structure 24 may include an organic material, an inorganic material, an organic/inorganic hybrid material, the above-mentioned materials doped with black pigment and/or black particles, or other suitable isolation materials, and the protection layer 30 may include optical clear resin (OCR), optical clear adhesive (OCA), or other suitable materials.

In some embodiments, each of the color conversion layers 26 may include a first material layer 26A and a second material layer 26B, and the first material layer 26A may be disposed between the second material layer 26B and the second substrate 22 in the third direction D3. In some embodiments, the second material layer 26B may include a photoluminescence layer, and the first material layer 26A may include a color filtering layer, but not limited thereto. The photoluminescence layer described above may include a photoluminescence material, such as a quantum dot material, a fluorescent material, or other suitable photoluminescence materials, and the color filtering layer described above may include a color filtering material, such as color resist, or other suitable color filtering structures, but not limited thereto. In some embodiments, the light emitted from the light emitting element 16 may excite the photoluminescence material in the second material layer 26B for emitting light of different colors. The light emitted from the second material layer 26B and/or the light passing through the second material layer 26B may be filtered by the color filtering material in the first material layer 26A for making the required light (such as light within a specific wavelength range) pass through the second substrate 22 and exit from the surface S6 of the second substrate 22, and the surface S6 of the second substrate 22 may be regarded as a display surface, but not limited thereto. In some embodiments, the light emitting element 16 may include a light emitting diode configured to emit blue light, the second material layer 26B may include a quantum dot material capable of being excited by blue light for generating other colors of light (such as red light or green light), and the first material layer 26A may include red color resist, green color resist, blue color resist, or a color filtering material of other required colors, but not limited thereto.

It is worth noting that the structure of the light emitting plate 10 and the structure of the protection substrate 20 in the present disclosure are not limited to the condition described above and the condition shown in FIG. 4, and the light emitting plate 10 and the protection substrate 20 may be formed with other structures according to design needs. Additionally, in some embodiments, the filling element 54 may be disposed on the filling element 52 in the third direction D3, and the filling element 52 and the filling element 54 may directly contact the display panels DP respectively or not. Therefore, the filling element 52 and the filling element 54 may be disposed in the gap G between the two display panels DP adjoining each other, but the gap G is not limited to being fully filled with the filling element 52 and the filling element 54. In some embodiments, the optical density of the filling element 52 may be higher than the optical density of the filling element 54 for improving the interference between light from the light emitting elements 16 of different display panels DP, but not limited thereto. For example, the optical density of the filling element 52 may be higher than or equal to 2, such as being higher than or equal to 2 and lower than or equal to 6, and the optical density may be the logarithm of the ratio of incident light to transmitted light when the object is measured. In some embodiments, the water vapor transmission rate of the filling element 54 may be lower than the water vapor transmission rate of the filling element 52. In other words, the water vapor resistance of the filling element 54 may be higher than the water vapor resistance of the filling element 52 for enhancing the water vapor blocking performance at the gap G between the two display panels DP adjoining each other. For example, the water vapor transmission rate of the filling element 54 may be lower than or equal to 2 g/m$^2$/day, or the water vapor transmission rate of the filling element 54 may be lower than or equal to 10E-2 g/m$^2$/day for enhancing the water vapor resistance and reducing the penetration of water vapor into the color conversion layer 26 and/or the light emitting element 16, which may affect the life span and/or the reliability thereof. In some embodiments, the filling element 52 may include an adhesive material (such as silicone, acrylic gel, an epoxy-based material, or a mixed resin), a black pigment mixed with the adhesive material, black particles (such as carbon black), other materials capable of enhancing the optical density, or other suitable filling materials, and the filling element 54 may include silicone, an epoxy resin, a phenolic resin, a mixed resin, or other suitable filling materials. In some embodiments, the water vapor resistance of the material may be influenced by adding the material for enhancing the optical density (such as the black pigment and/or the black particles described above) to the material, and the material composition of the filling element 52 and the material composition of the filling element 54 described above may be adjusted according to their locations and the relatively required material characteristics at these locations for making the filling element 52 and the filling element 54 have different material compositions and different characteristics. Additionally, in some embodiments, a refractive index of the filling element 54 may be similar to a refractive index of the second substrate 22, or the refractive index of the filling element 54 may be lower than the refractive index of the second substrate 22 for reducing the influence of the filling element 54 on the appearance of the electronic device 101 and/or the display operation of the electronic device 101.

In some embodiments, a top surface of the filling element 52 (such as a surface S7 shown in FIG. 4) may be higher than or aligned with a surface of the first isolation structure 24 facing the light emitting plate 10 (such as a surface S3 shown in FIG. 4) in the third direction D3 for avoiding the light emitting interference between the light emitting elements 16 of different display panels DP, which may be generated by the space between the filling element 52 and the first isolation structure 24, wherein the being aligned in this disclosure only refers to being roughly aligned, and some slight errors may be tolerated. It is worth noting that, in the present disclosure, the relative height of the surface in the third direction D3 may be compared by taking the surface D1 of the first substrate 12 as a reference, the position relatively closer to the surface S1 of the first substrate 12 may be regarded as a lower position in the third direction D3, and the position relatively away from the surface S1 of the first substrate 12 may be regarded as an upper position in the third direction D3. In other words, a height H of the filling element 52 in the third direction D3 (may also be regarded as a length of the filling element 52 in the third direction D3) may be greater than or equal to a height H1 marked in FIG. 4, and the height H1 may be regarded as a distance between the surface S1 of the first substrate 12 and the surface S3 of the first isolation structure 24 in the third direction D3, but not limited thereto. Additionally, in some embodiments, a top surface of the filling element 54 (such as a surface S8 shown in FIG. 4) may be aligned with or slightly lower than the surface S6 of the second substrate 22 in the third direction D3, but not limited thereto. In some embodiments, the surface S8 of the filling element 54 may include a flat surface, a curved surface, or a rough surface. In addition, a surface of the color conversion layer 26 facing the light emitting plate 10 (such as a surface S4 shown in FIG. 4, and the surface S4 may also be regarded as a surface of the second material layer 26B facing the light emitting plate 10) may include a flat surface, a convex surface, a concave surface, or a surface with other configurations. In some embodiments, the surface S4 of the color conversion layer 26 may be substantially aligned with the surface S3 of the first isolation structure 24 in the third direction D3, but not limited thereto.

It is worth noting that the features of the electronic device in the present disclosure can also be applied to other types of electronic devices, such as smart windows, antennas, and touch devices. For example, the non-self-luminous display elements in the light emitting plate may be replaced by other working medium layers, and the working medium layer may include, for example, liquid crystal for liquid crystal antennas, liquid crystal for liquid crystal windows or other working mediums with specific and required functions.

The following description will detail the different embodiments of the present disclosure. To simplify the description, the following description will detail the dissimilarities among different embodiments and the identical features will not be redundantly described. In addition, identical components in each of the following embodiments are marked with identical symbols for making it easier to understand the differences between the embodiments. The features in each of the embodiments may be mixed or combined without departing from the spirit of the present disclosure or conflicting with each other.

Figure 5:
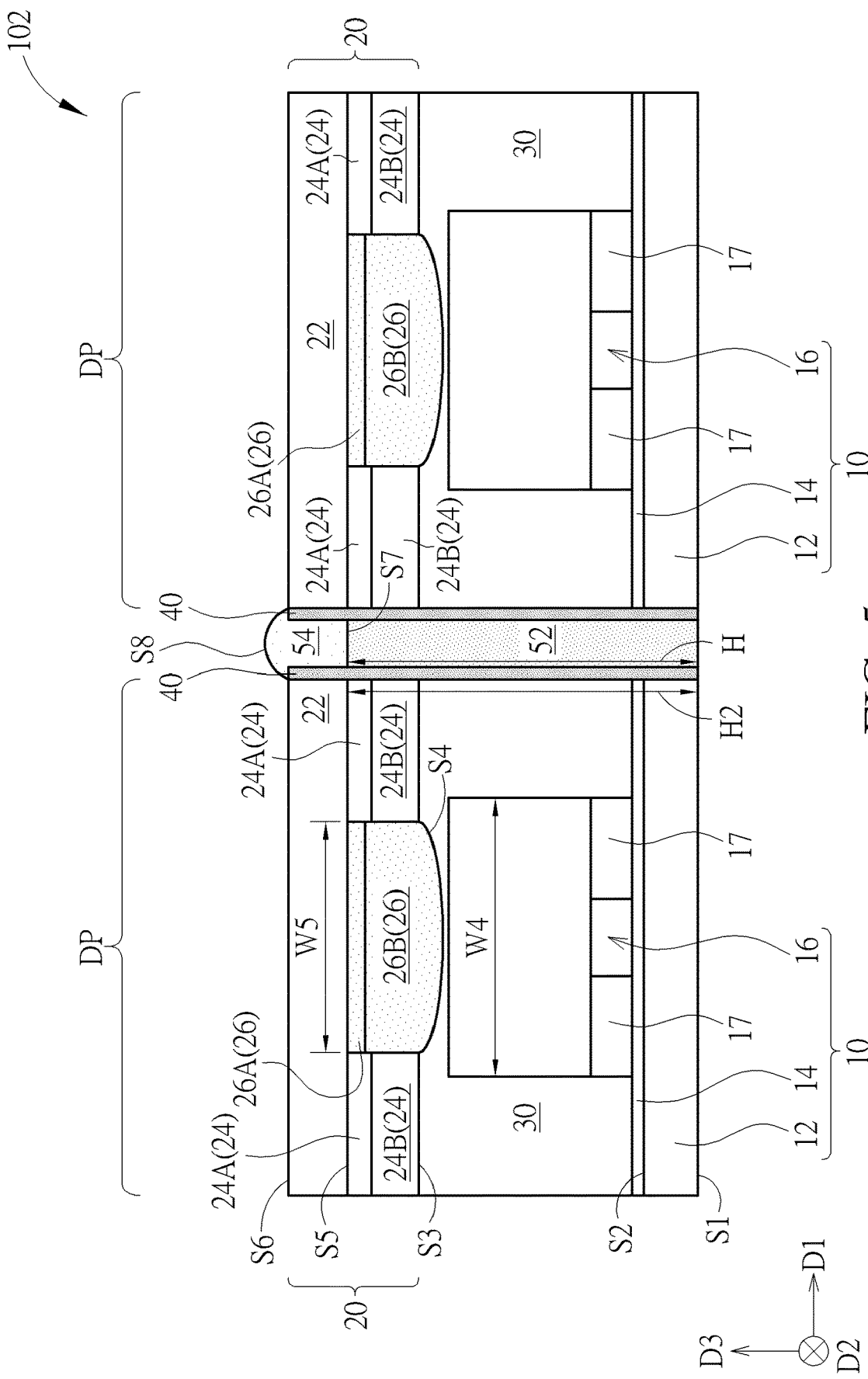
FIG. 5 is a cross-sectional schematic diagram illustrating an electronic device according to a second embodiment of the present disclosure.

Please refer to FIG. 5. FIG. 5 is a cross-sectional schematic diagram illustrating an electronic device 102 according to a second embodiment of the present disclosure. As shown in FIG. 5, in some embodiments, the electronic device 102 may further include an encapsulation material 40 disposed between the filling element 52 and each of the display panels DP and disposed between the filling element 54 and each of the display panels DP. In some embodiments, before tiling the display panels DP, the encapsulation material 40 may be formed on at least one lateral side of the display panel DP for edge sealing and enhancing the protection performance. In some embodiments, the encapsulation material 40 may include a single layer or multiple layers of an organic material, an inorganic material, an organic/inorganic hybrid material, or other suitable material compositions. For example, the encapsulation material 40 may include an inorganic-organic-inorganic (IOI) composite material, wherein the inorganic material may include silicon oxide, silicon nitride, silicon oxynitride, or other suitable inorganic encapsulation materials, and the organic material may include organic resin or other suitable organic encapsulation materials. In some embodiments, the water vapor transmission rate of the encapsulation material 40 may be lower than the water vapor transmission rate of the filling element 52 for improving the water vapor resistance applied to the display panel DP, but not limited thereto.

Additionally, in some embodiments, the first isolation structure 24 may include a first portion 24A and a second portion 24B. The first portion 24A is disposed between the second portion 24B and the second substrate 22, and a material of the first portion 24A may be different from a material of the second portion 24B. For example, the first portion 24A of the first isolation structure 24 may be used to provide light shielding effect, and the second portion 24B of the first isolation structure 24 may be used to provide banking effect. Therefore, the optical density of the first portion 24A may be higher than that of the second portion 24B, and the first portion 24A may include black matrix resist or other materials with relatively higher optical density, for example, but not limited thereto. In some embodiments, the surface S4 of the color conversion layer 26 facing the light emitting plate 10 may be a convex surface protruding towards the light emitting element 16, and the surface S4 of the color conversion layer 26 may be lower than the surface S3 of the first isolation structure 24 in the third direction D3 accordingly, but not limited thereto. In some embodiments, the width W4 of the light emitting element 16 may be greater than the width W5 of the corresponding color conversion layer 26, but not limited thereto. In some embodiments, the surface S8 of the filling element 54 may be a curved surface protruding outwards, and the filling element 54 may be partially disposed on the encapsulation material 40 in the third direction D3, but not limited thereto.

In some embodiments, the top surface of the filling element 52 (such as the surface S7) may be lower than or aligned with a surface of the second substrate 22 facing the light emitting plate 10 (such as the surface S5) in the third direction D3 for avoiding the light emitting interference between the light emitting elements 16 of different display panels DP, which may be generated by the portion with relatively lower optical density in the first isolation structure 24 (such as the second portion 24B). In other words, the height H of the filling element 52 in the third direction D3 may be greater than or equal to a height H2 marked in FIG. 5, and the height H2 may be regarded as a distance between the surface S1 of the first substrate 12 and the surface S5 of the second substrate 22 in the third direction D3, but not limited thereto. As shown in FIG. 4 and FIG. 5, in some embodiments, the height H of the filling element 52 in the third direction D3 may range from the height H1 marked in FIG. 4 and the height H2 marked in FIG. 5. In other words, the surface S7 of the filling element 52 may be higher than or aligned with the surface S3 of the first isolation structure 24 facing the light emitting plate 10 in the third direction D3 and lower than or aligned with the surface S5 of the second substrate 22 facing the light emitting plate 10 in the third direction D3, but not limited thereto. It is worth noting that the technical features of the electronic device 102 in this embodiment that are different from the electronic device 101 shown in FIG. 4 may also be applied to other embodiments of the present disclosure according to design needs.

Figure 6:
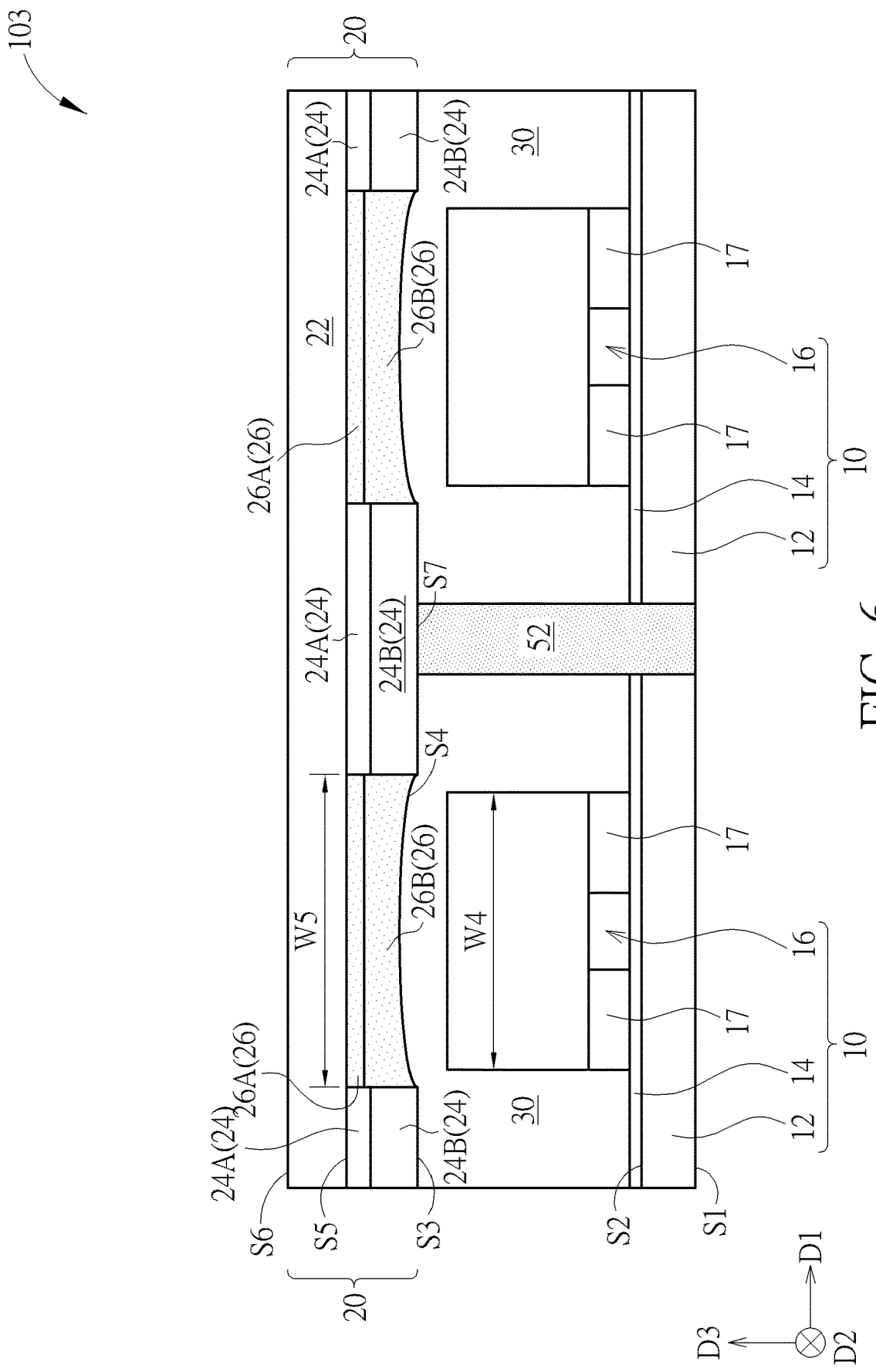
FIG. 6 is a cross-sectional schematic diagram illustrating an electronic device according to a third embodiment of the present disclosure.

Please refer to FIG. 6. FIG. 6 is a cross-sectional schematic diagram illustrating an electronic device 103 according to a third embodiment of the present disclosure. As shown in FIG. 6, the electronic device 103 includes the protection substrate 20, two light emitting plates 10, and a filling element (such as the filling element 52). The two light emitting plates 10 adjoin each other and are disposed corresponding to the protection substrate 20, and the two light emitting plates 10 emit light towards the protection substrate 20. The filling element 52 is disposed between the two light emitting plates 10. It should be noted that, each of the two light emitting plates 10 comprises a first substrate 12 and light emitting elements 16 disposed on the first substrate 12, and the protection substrate 20 comprises a second substrate 22 and a color conversion layer 26 disposed on the second substrate 22. In other words, in some embodiments, a plurality of the light emitting plates 10 may be disposed corresponding to the same protection substrate 20, and the filling element 52 may be located between the light emitting plates 10 adjoining one another in a horizontal direction (such as the first direction D1) and located under the protection substrate 20 (such as the first isolation structure 24 in the protection substrate 20) in a vertical direction (such as the third direction D3). In some embodiments, the surface S7 of the filling element 52 may directly contact the surface S3 of the first isolation structure 24, but not limited thereto. In the configuration described above, the optical density of the filling element 52 may be higher than or equal to 2, such as being higher than or equal to 2 and lower than or equal to 6, for improving the light emitting interference between the light emitting elements 16 of different display panels DP, but not limited thereto. Additionally, in some embodiments, the width of the color conversion layer 26 may be greater than the width W4 of the corresponding light emitting element 16 for increasing the area of the color conversion layer 26 in each pixel region, but not limited thereto. In some embodiments, the surface S4 of the color conversion layer 26 facing the light emitting plate 10 may be a concave surface towards the second substrate 22, and at least a portion of the surface S4 of the color conversion layer 26 may be higher than the surface S3 of the first isolation structure 24 in the third direction D3 accordingly, but not limited thereto. In some embodiments, the manufacturing method of the electronic device 103 may include but is not limited to combining the light emitting plates 10 and the protection substrate 20 (such as using the protection layer 20 for bonding, but not limited thereto) first and forming the filling element 52 in the gap between the light emitting plates 10 subsequently. It is worth noting that the technical features of the electronic device 103 in this embodiment that are different from the electronic device 101 shown in FIG. 4 may also be applied to other embodiments of the present disclosure according to design needs.

Figure 7:
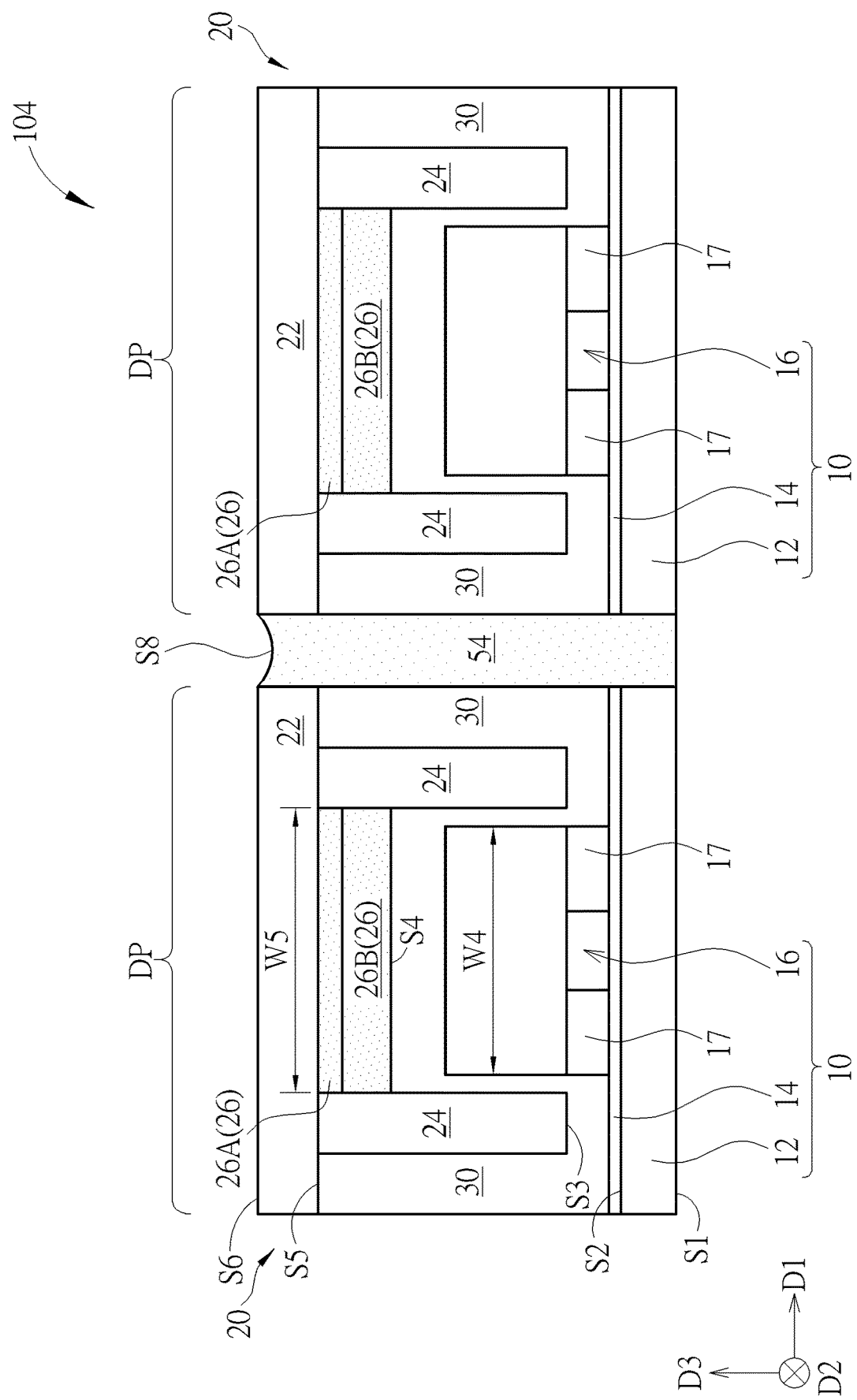
FIG. 7 is a cross-sectional schematic diagram illustrating an electronic device according to a fourth embodiment of the present disclosure.

Please refer to FIG. 7. FIG. 7 is a cross-sectional schematic diagram illustrating an electronic device 104 according to a fourth embodiment of the present disclosure. As shown in FIG. 7, in the electronic device 104, at least a portion of the surface S5 of the second substrate 22 may not be covered by the color conversion layer 26 or the first isolation structure 24, at least a portion of the light entering the electronic device 104 from the surface S1 of the first substrate 12 may pass through the electronic device 104 and emit outwards from the surface S6 of the second substrate 22, and each of the display panels DP under this configuration may be regarded as a transparent display panel, but not limited thereto. In some embodiments, the first isolation structure 24 may extend from the surface S5 of the second substrate 22 towards the first substrate 12 and surround at least a portion of the corresponding light emitting element 16 for improving the light emitting interference between the light emitting elements 16 of different display panels DP, especially when the optical density of the first isolation structure 24 is relatively higher (such as higher than or equal to 2), but not limited thereto, wherein the surrounding an object in this disclosure may refer to being disposed at the periphery of the object, but not limited thereto. In addition, with the design of the first isolation structure 24 described above, the width W5 of the color conversion layer 26 may be greater than the width W4 of the corresponding light emitting element 16, and the surface S3 of the first isolation structure 24 may be lower than the surface S4 of the color conversion layer 26 and the top surface (such as the topmost surface) of the light emitting element 16 in the third direction D3, but the surface S3 of the first isolation structure 24 may not directly contact the first substrate 12 or the circuit structure 14 on the first substrate 12, but not limited thereto. In some embodiments, with the first isolation structure 24 having higher optical density and surrounding the light emitting element 16, the filling element 54 may be disposed in the gap between the display panels DP adjoining each other without disposing the filling element 52 described above for improving the water vapor resistance performance, but not limited thereto. Additionally, in some embodiments, the surface S8 of the filling element 54 may include a curved and concave surface, and at least a portion of the surface S8 of the filling element 54 may be lower than the surface S6 of the second substrate 22 in the third direction D3 accordingly, but not limited thereto. It is worth noting that the technical features of the electronic device 104 in this embodiment that are different from the electronic device 101 shown in FIG. 4 may also be applied to other embodiments of the present disclosure according to design needs.

Figure 8:
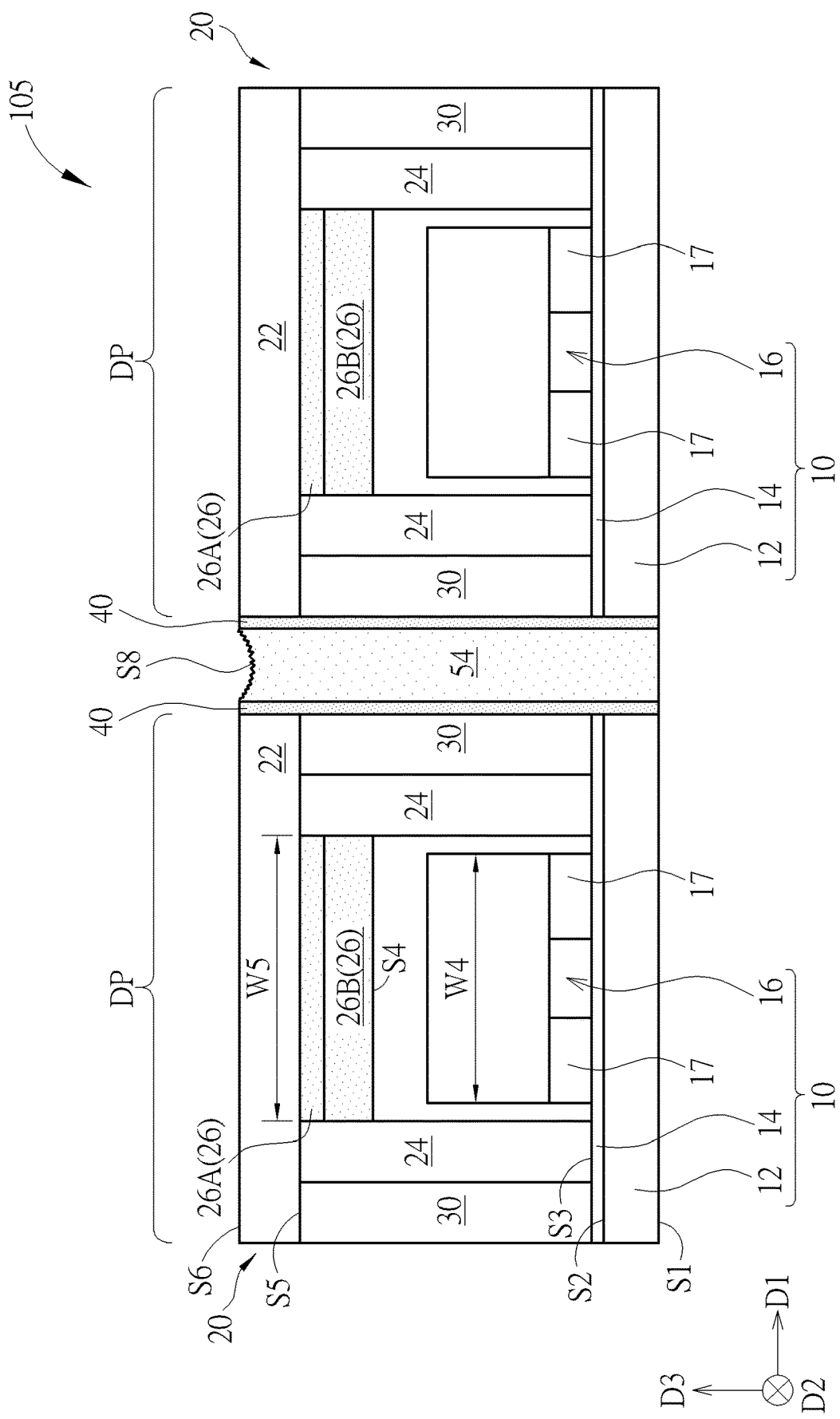
FIG. 8 is a cross-sectional schematic diagram illustrating an electronic device according to a fifth embodiment of the present disclosure.

Please refer to FIG. 8. FIG. 8 is a cross-sectional schematic diagram illustrating an electronic device 105 according to a fifth embodiment of the present disclosure. As shown in FIG. 8, in the electronic device 105, at least a portion of the surface S5 of the second substrate 22 is not covered by the color conversion layer 26 or the first isolation structure 24, at least a portion of the light entering the electronic device 105 from the surface S1 of the first substrate 12 may pass through the electronic device 105 and emit outwards from the surface S6 of the second substrate 22, and each of the display panels DP under this configuration may be regarded as a transparent display panel, but not limited thereto. In some embodiments, the first isolation structure 24 may extend from the surface S5 of the second substrate 22 towards the first substrate 12 and surround at least a portion of the corresponding light emitting element 16 for improving the light emitting interference between the light emitting elements 16 of different display panels DP, especially when the optical density of the first isolation structure 24 is relatively higher (such as higher than or equal to 2), but not limited thereto. In addition, with the design of the first isolation structure 24 described above, the width W5 of the color conversion layer 26 may be greater than the width W4 of the corresponding light emitting element 16, the surface S3 of the first isolation structure 24 may be lower than the surface S4 of the color conversion layer 26 and the top surface (such as the topmost surface) of the light emitting element 16 in the third direction D3, and the surface S3 of the first isolation structure 24 may contact the circuit structure 14, but not limited thereto. In some embodiments, with the first isolation structure 24 having higher optical density and surrounding the light emitting element 16, the filling element 54 may be disposed in the gap between the display panels DP adjoining each other without disposing the filling element 52 described above for improving the water vapor resistance performance, but not limited thereto. Additionally, in some embodiments, the electronic device 105 may further include the encapsulation material 40 disposed between the filling element 54 and each of the display panels DP for further enhancing the water vapor resistance applied to the display panel DP, but not limited thereto. In addition, the surface S8 of the filling element 54 may include a rough and concave surface, and at least a portion of the surface S8 of the filling element 54 may be lower than the surface S6 of the second substrate 22 in the third direction D3 accordingly. When the surface S8 of the filling element 54 is a rough surface, it may assist light scattering and reduce the visibility of the gap in the electronic device for enhancing the visual effect, but not limited thereto. It is worth noting that the technical features of the electronic device 105 in this embodiment that are different from the electronic device 101 shown in FIG. 4 may also be applied to other embodiments of the present disclosure according to design needs.

Figure 9:
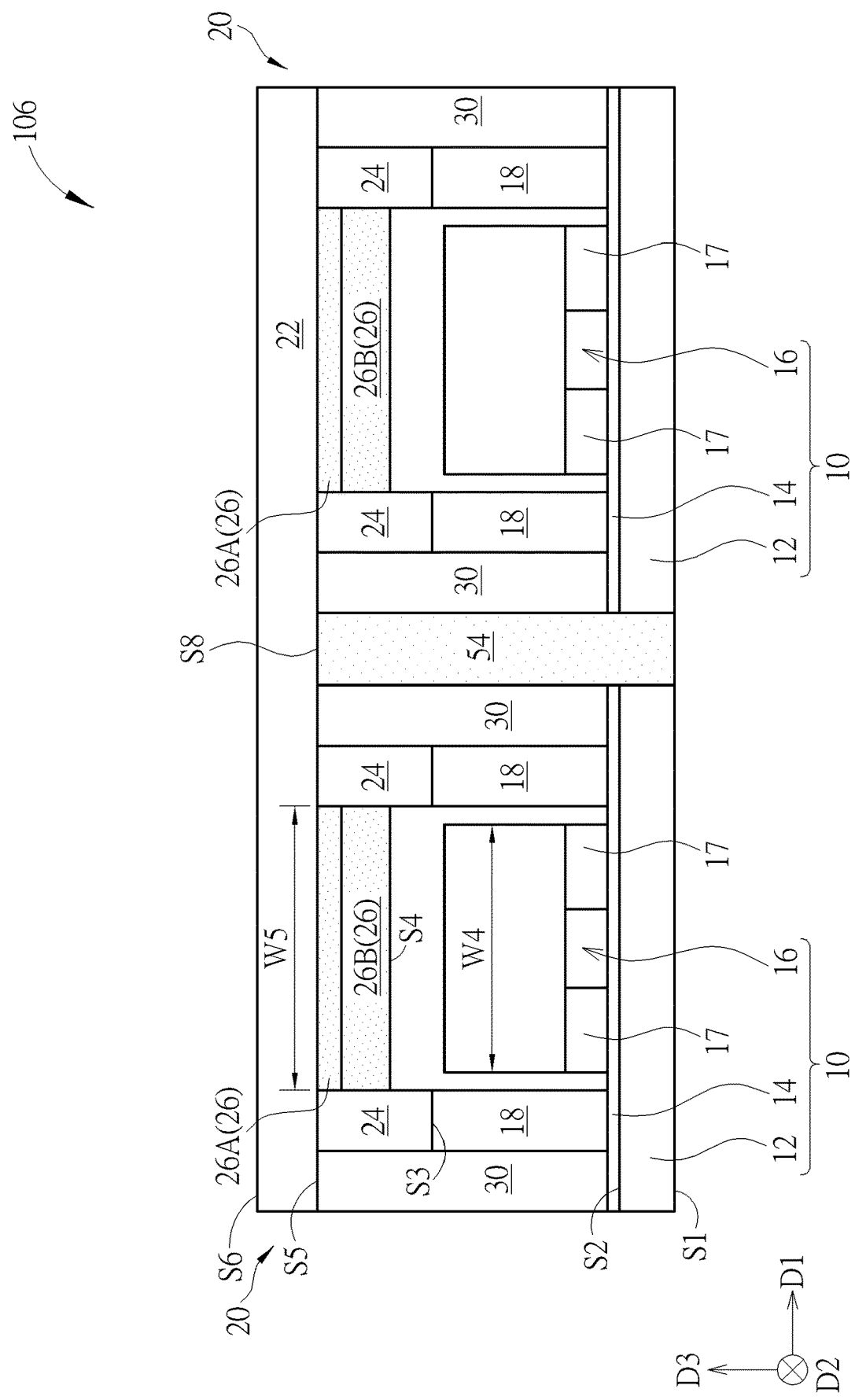
FIG. 9 is a cross-sectional schematic diagram illustrating an electronic device according to a sixth embodiment of the present disclosure.

Please refer to FIG. 9. FIG. 9 is a cross-sectional schematic diagram illustrating an electronic device 106 according to a sixth embodiment of the present disclosure. As shown in FIG. 9, in the electronic device 106, the two light emitting plates 10 adjoin each other and are disposed under the protection substrate 20 for emitting light towards the protection substrate 20, and the filling element 54 may be disposed between the two light emitting plates 10. In other words, in some embodiments, a plurality of the light emitting plates 10 may be disposed corresponding to the same protection substrate 20, and the filling element 54 may be located between the light emitting plates 10 adjoining one another in a horizontal direction (such as the first direction D1). In some embodiments, the surface S8 of the filling element 54 may directly contact the surface S5 of the second substrate 22, but not limited thereto. Additionally, in some embodiments, at least a portion of the surface S5 of the second substrate 22 is not covered by the color conversion layer 26, the first isolation structure 24, or the filling element 54, at least a portion of the light entering the electronic device 106 from the surface S1 of the first substrate 12 may pass through the electronic device 106 and emit outwards from the surface S6 of the second substrate 22, and the electronic device 106 under this configuration may be regarded as a transparent display device, but not limited thereto. In the configuration described above, the filling element 54 may be a transparent material for enhancing the effect of transparent display, but not limited thereto. Additionally, in some embodiments, the electronic device 106 may further include a second isolation structure 18 disposed on the surface S2 of the first substrate 12, and the second isolation structure 18 may surround the light emitting element 16 in the horizontal direction (such as the first direction D1 and/or the second direction D2). In some embodiments, the material composition of the second isolation structure 18 may be similar to that of the first isolation structure 24, and the second isolation structure 18 may be disposed corresponding to and connected with the first isolation structure 24 in the third direction D3, but not limited thereto. In some embodiments, the manufacturing method of the electronic device 106 may include but is not limited to the following step. After forming the circuit structure 14, the light emitting elements 16, and the second isolation structure 18 on the first substrate 12 and forming the color conversion layer 26 and the first isolation structure 24 on the second substrate 22, the protection substrate 20 and the light emitting plates 10 are combined, and the filling element 54 is formed in the gap between the light emitting plates 10 subsequently. It is worth noting that the technical features of the electronic device 106 in this embodiment that are different from the electronic device 101 shown in FIG. 4 may also be applied to other embodiments of the present disclosure according to design needs.

Figure 10:
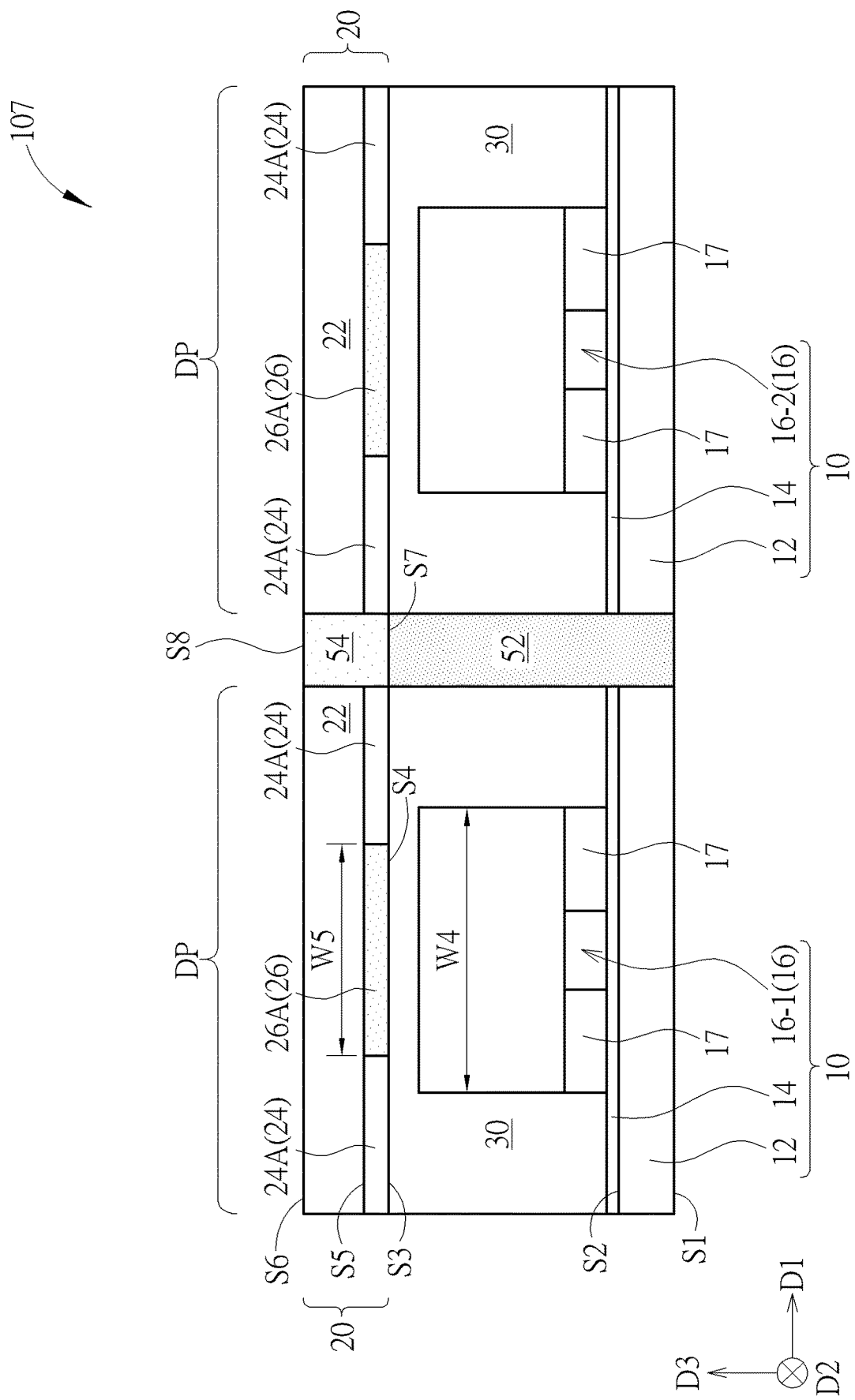
FIG. 10 is a cross-sectional schematic diagram illustrating an electronic device according to a seventh embodiment of the present disclosure.

Please refer to FIG. 10. FIG. 10 is a cross-sectional schematic diagram illustrating an electronic device 107 according to a seventh embodiment of the present disclosure. As shown in FIG. 10, in the electronic device 107, at least a portion of the light emitting elements 16 may emit light of different colors. In some embodiments, the light emitting elements 16 may include a first light emitting element 16-1 and a second light emitting element 16-2, and the color of light emitted by the first light emitting element 16-1 may be different from the color of light emitted by the second light emitting element 16-2. For example, the first light emitting element 16-1 may be a red light emitting element (such as a red LED) configured to emit red light, and the second light emitting element 16-2 may be a green light emitting element (such as a green LED) configured to emit green light, but not limited thereto. In some embodiments, the light emitting elements 16 may include light emitting elements configured to emit light of different colors (such as a blue light emitting element, a yellow light emitting element, a white light emitting element, and so forth) according to design needs. In addition, it is not necessary to dispose the second material layer 26B of the embodiment described above in the electronic device 107 because the light emitting elements 16 themselves may produce light of different colors, and the first material layer 26A may have different colors according to the color of light emitted by the corresponding light emitting element 16. For example, the first material layer 26A disposed corresponding to the first light emitting element 16-1 may include a red resist material when the first light emitting element 16-1 is a red light emitting element, and the first material layer 26A disposed corresponding to the second light emitting element 16-2 may include a green resist material when the second light emitting element 16-2 is a green light emitting element, but not limited thereto. It is worth noting that the technical feature of using the light emitting elements capable of emitting light of different colors in the electronic device 107 of this embodiment and the technical feature without disposing the second material layer in the color conversion layer in this embodiment may also be applied to other embodiments of the present disclosure according to design needs.

Figure 11:
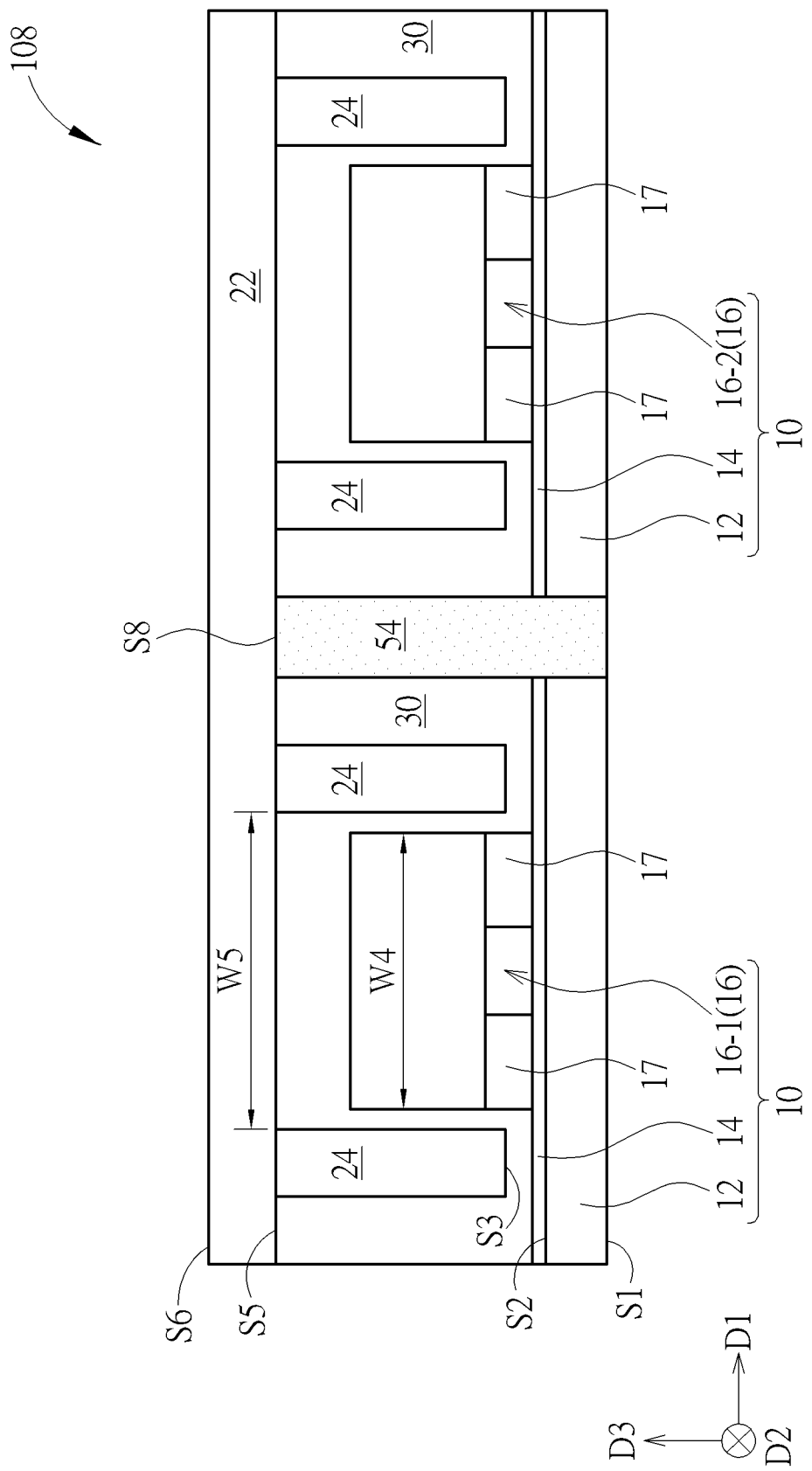
FIG. 11 is a cross-sectional schematic diagram illustrating an electronic device according to an eighth embodiment of the present disclosure.

Please refer to FIG. 11. FIG. 11 is a cross-sectional schematic diagram illustrating an electronic device 108 according to an eighth embodiment of the present disclosure. As shown in FIG. 11, in the electronic device 108, the two light emitting plates 10 adjoin each other and are disposed under the second substrate 22 for emitting light towards the second substrate 22, and the filling element 54 may be disposed between the two light emitting plates 10. In other words, in some embodiments, a plurality of the light emitting plates 10 may be disposed corresponding to the same second substrate 22, and the filling element 54 may be located between the light emitting plates 10 adjoining one another in a horizontal direction (such as the first direction D1). In some embodiments, the surface S8 of the filling element 54 may directly contact the surface S5 of the second substrate 22, but not limited thereto. In some embodiments, at least a portion of the light emitting elements 16 may emit light of different colors. For example, the light emitting elements 16 may include the first light emitting element 16-1 and the second light emitting element 16-2 described above, but not limited thereto. In addition, it is not necessary to dispose the color conversion layer 26 of the embodiment described above in the electronic device 108 because the light emitting elements 16 themselves may produce light of different colors, and the first isolation structure 24 may extend from the surface S5 of the second substrate 22 towards the first substrate 12 and surround at least a portion of the corresponding light emitting element 16 for improving the light emitting interference between different light emitting elements 16, but not limited thereto. In addition, with the design of the first isolation structure 24 described above, the surface S3 of the first isolation structure 24 may be lower than the top surface (such as the topmost surface) of the light emitting element 16 in the third direction D3, but the surface S3 of the first isolation structure 24 may not directly contact the first substrate 12 or the circuit structure 14 on the first substrate 12, but not limited thereto. In some embodiments, with the first isolation structure 24 having higher optical density and surrounding the light emitting element 16, the filling element 54 may be disposed in the gap between the light emitting plates 10 adjoining each other without disposing the filling element 52 described above for improving the water vapor resistance performance, but not limited thereto. Additionally, in some embodiments, at least a portion of the surface S5 of the second substrate 22 is not covered by the first isolation structure 24 or the filling element 54, at least a portion of the light entering the electronic device 108 from the surface S1 of the first substrate 12 may pass through the electronic device 108 and emit outwards from the surface S6 of the second substrate 22, and the electronic device 108 under this configuration may be regarded as a transparent display device, but not limited thereto. In the configuration described above, the filling element 54 may be a transparent material for enhancing the effect of transparent display or reducing the visibility of the gap in the electronic device, but not limited thereto. It is worth noting that the technical feature of using the light emitting elements capable of emitting light of different colors in the electronic device 108 of this embodiment and the technical feature without disposing the color conversion layer in this embodiment may also be applied to other embodiments of the present disclosure according to design needs.

To summarize the above descriptions, in the electronic device of the present disclosure, the filling element may be disposed between the display panels adjoining one another or between the light emitting plates adjoining one another and the material composition of the filling element may be adjusted according to the location of the filling element and the relatively required material characteristics at this location for improving the related performance of the electronic device, such as display effect, life span and/or product reliability.

Although the embodiments and advantages thereof in the present disclosure have been disclosed as above, it should be understood that anyone with ordinary knowledge in the related technical field can make changes, substitutions, and decorations without departing from the spirit and the scope of this disclosure. Additionally, the scope of the protected range of this disclosure is not limited to the processes, machines, manufacturing, material compositions, devices, methods, and steps in the specific embodiments described in the description. Any person with ordinary knowledge in the related technical field may understand the current or future development of processes, machines, manufacturing, material composition, devices, methods and steps from the disclosed contents in this disclosure, as long as the substantially same functions carried out in the described embodiments or the substantially same results obtained in the described embodiments may be used in accordance with the present disclosure. Therefore, the protection scope of the present disclosure includes the above-mentioned processes, machines, manufacturing, material composition, devices, methods and steps. Additionally, each claim constitutes a separate embodiment, and the protection scope of the present disclosure also includes a combination of the claims and the embodiments. The protection scope of the present disclosure shall be determined by the scope of the claims listed below.

The above description is only related to the embodiments of the present invention, but not used for limiting the present invention. Those skilled in the art will readily observe that the present invention may have numerous modifications and alterations. Any modifications, equivalents replacements, improvements, etc. made in the spirits and principles of the present invention should be construed as the appended claims of the present invention.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
    two display panels adjoining each other;
    a first filling element and a second filling element, wherein the first filling element and the second filling element are disposed between the two display panels, and a material of the first filling element is different from a material of the second filling element; and
    an encapsulation material disposed between the first filling element and each of the two display panels and disposed between the second filling element and each of the two display panels.

2. The electronic device according to claim 1, wherein a surface of the second filling element comprises a flat surface, a curved surface, or a rough surface.

3. The electronic device according to claim 1, wherein an optical density (OD) of the first filling element is higher than or equal to an optical density of the second filling element.

4. The electronic device according to claim 3, wherein the optical density of the first filling element is higher than or equal to 2.

5. The electronic device according to claim 1, wherein a water vapor transmission rate (WVTR) of the first filling element is lower than or equal to a water vapor transmission rate of the second filling element.

6. The electronic device according to claim 5, wherein the water vapor transmission rate of the first filling element is lower than or equal to 2 g/m$^2$/day.

7. The electronic device according to claim 6, wherein the water vapor transmission rate of the first filling element is lower than or equal to $10^{-2}$ g/m$^2$/day.

8. The electronic device according to claim 1, wherein each of the two display panels comprises:
    a light emitting plate comprising a first substrate and light emitting elements disposed on the first substrate; and
    a protection substrate, wherein the first filling element is disposed between the light emitting plates of the two display panels, and the second filling element is disposed between the protection substrates of the two display panels.

9. The electronic device according to claim 8, wherein each of the protection substrates comprises:
    a second substrate; and
    a color conversion layer disposed on the second substrate.

10. The electronic device according to claim 9, wherein each of the two display panels further comprises:
    a first isolation structure disposed on the second substrate and surrounding the color conversion layer; and
    a second isolation structure disposed on the first substrate and surrounding the light emitting element, wherein the second isolation structure is disposed corresponding to and connected with the first isolation structure in in a vertical direction.

11. The electronic device according to claim 9, wherein a surface of the color conversion layer facing the light emitting plate comprises a flat surface, a convex surface, or a concave surface.

12. The electronic device according to claim 9, wherein each of the color conversion layers comprises:
    a first material layer; and
    a second material layer, wherein the first material layer is disposed between the second material layer and the second substrate.

13. The electronic device according to claim 12, wherein the second material layer comprises a photoluminescence layer and the first material layer comprises a color filtering layer.

14. The electronic device according to claim 9, wherein each of the two display panels further comprises a first isolation structure disposed on the second substrate and surrounding the color conversion layer, and the first isolation structure comprises a first portion and a second portion, wherein the first portion is disposed between the second portion and the second substrate, and a material of the first portion is different from a material of the second portion.

15. The electronic device according to claim 14, wherein the second filling element is disposed on the first filling element in a vertical direction, a top surface of the first filling element is higher than or aligned with a surface of the first isolation structure facing the light emitting plate in the vertical direction, and the top surface of the first filling element is lower than or aligned with a surface of the second substrate facing the light emitting plate in the vertical direction.

* * * * *